(12) United States Patent
Chen et al.

(10) Patent No.: US 7,164,163 B2
(45) Date of Patent: Jan. 16, 2007

(54) STRAINED TRANSISTOR WITH HYBRID-STRAIN INDUCING LAYER

(75) Inventors: Chien-Hao Chen, Chuangwei Township (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/062,723

(22) Filed: Feb. 22, 2005

(65) Prior Publication Data
US 2006/0186470 A1   Aug. 24, 2006

(51) Int. Cl.
*H01L 29/76* (2006.01)
(52) U.S. Cl. .................. 257/288; 257/E21.409
(58) Field of Classification Search ............... 257/344, 257/369, 408, E21.409
See application file for complete search history.

(56) References Cited

U.S. PATENT DOCUMENTS

| 6,621,131 | B1 * | 9/2003 | Murthy et al. | 257/408 |
|---|---|---|---|---|
| 6,825,529 | B1 * | 11/2004 | Chidambarrao et al. | 257/336 |
| 2004/0075148 | A1 * | 4/2004 | Kumagai et al. | 257/369 |
| 2004/0135234 | A1 * | 7/2004 | Morin et al. | 257/635 |
| 2005/0093078 | A1 * | 5/2005 | Chan et al. | 257/374 |
| 2005/0260810 | A1 * | 11/2005 | Cheng et al. | 438/199 |
| 2005/0266639 | A1 * | 12/2005 | Frohberg et al. | 438/257 |

OTHER PUBLICATIONS

Ito, S., et al., "Mechanical Stress Effect of Etch-Stop Nitride and its Impact on Deep Submicron Transistor Design," IEDM Technical Digest, Apr. 2000, pp. 247-250, IEEE.

Ootsuka, F., et al., "A Highly Dense, High-Performance 130nm node CMOS Technology for Large Scale System-on-a-Chip Applications," IEDM Technical Digest, Apr. 2000, pp. 575-578, IEEE.

Scott, G., et al., "NMOS Drive Current Reduction Caused by Transistor Layout and Trench Isolation Induced Stress," IEDM Technical Digest, Sep. 1999, pp. 827-830, IEEE.

Shimizu, A., et al., "Local Mechanical-Stress Control (LMC): A New Technique for CMOS-Performance Enhancement," IEDM Technical Digest, Mar. 2001, pp. 433-436, IEEE.

\* cited by examiner

*Primary Examiner*—Trung Dang
(74) *Attorney, Agent, or Firm*—Slater & Matsil, L.L.P.

(57) ABSTRACT

A semiconductor device having a hybrid-strained layer and a method of forming the same are discussed. The semiconductor device comprises: a gate dielectric over a substrate; a gate electrode over the gate dielectric; an optional pair of spacers along the sidewalls of the gate dielectric and the gate electrode; a source/drain region substantially aligned with an edge of the gate electrode; and a strained layer over the source/drain region, gate electrode, and spacers wherein the strained layer has a first portion and a second portion. The first portion of the strained layer is substantially over the source/drain region and has a first inherent strain. The second portion of the strained layer has at least a portion substantially over the gate electrode and the spacers and has a second inherent strain of the opposite type of the first strain.

20 Claims, 4 Drawing Sheets

US 7,164,163 B2

STRAINED TRANSISTOR WITH HYBRID-STRAIN INDUCING LAYER

TECHNICAL FIELD

This invention generally relates to semiconductor devices, specifically to devices with a hybrid-strained layer over gate and source/drain regions, and more specifically to MOS devices with a hybrid-strained contact etch stop layer.

BACKGROUND

The scaling of VLSI circuits is a constant effort. With circuits becoming smaller and faster, device driving current improvement becomes more important. Device current is closely related to gate length, gate capacitance, and carrier mobility. Shortening poly-gate length, increasing gate capacitance, and increasing carrier mobility can improve the device's current performance. Gate length reduction is an on-going effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a strained silicon channel is a known practice. Strain, some times referred to as stress, can enhance bulk electron and hole mobility. The performance of a MOS device can be enhanced through a strained-surface channel. This technique allows performance to be improved at a constant gate length, without adding complexity to circuit fabrication or design.

When silicon is placed under strain, the in-plane, room temperature electron mobility is dramatically increased. One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of Si, the Si film is under biaxial tension and thus the carriers exhibit strain-enhanced mobility.

Strain in a device may have components in three directions; parallel to the MOS device channel length, parallel to the device channel width, and perpendicular to the channel plane. The strains parallel to the device channel length and width are called in-plane strains. Research has revealed that bi-axial, in-plane tensile strain field can improve nMOS performance, and compressive strain parallel to channel length direction can improve pMOS device performance.

Strain can also be applied by forming a strained contact etching stop (CES) layer on MOS device. When a contact etching stop layer is deposited, due to the lattice spacing mismatch between the CES layer and underlying layer, an in-plane stress develops to match the lattice spacing. FIG. 1 illustrates a conventional nMOS device having a strained channel region. CES layer 14 has inherent tensile strain. The portions 14a of the CES layer on the top of the source/drain regions 12 introduce a compressive strain in source/drain regions 12 and thus cause a tensile strain in channel region 11. Therefore, the carrier mobility in the channel region 11 is improved. However, the CES layer 14 is uni-strained, which means that the same tensile strained CES layer is also capped on the top of the gate electrode 6 and spacers 8. The cap portion has the effect of introducing compressive strain into the underlying regions including channel region 11 so that the overall channel tensile strain is reduced.

The strain in the channel region 11 can be improved by forming an uncapped CES layer, in which the CES layer 14 is not formed on top of the electrode 6 and spacers 8. What is needed, however, is a method of improving a CES layer's ability to impose desirable strain to the channel without adding much complexity into the manufacturing process.

SUMMARY OF THE INVENTION

The preferred embodiment of the present invention presents a semiconductor device having a hybrid-strained layer and a method of forming the same.

In accordance with one aspect of the present invention, the semiconductor device comprises: a gate dielectric over a substrate; a gate electrode over the gate dielectric; a pair of spacers along the sidewalls of the gate dielectric and the gate electrode; a source/drain region substantially aligned with edge of the gate electrode; and a strained layer over the source/region, gate electrode, and spacers. The strained layer has a first portion and a second portion. The first portion of the strained layer is substantially over the source/drain region and has a first inherent strain. The second portion of the strained layer has at least a portion substantially over the gate electrode and the gate spacers and has a second inherent strain of the opposite type of the first strain. By having opposite type of strains in the first portion and second portion of the strained layer, the adverse effect caused by the second portion is converted into beneficial effect. Strain in the device channel region is thus enhanced.

In accordance with another aspect of the present invention, the second portion of the strained layer has the same type of strain as the first portion. However, the magnitude of the strain in the second portion is lower, preferably lower than 50 percent of the strain in the first portion. With smaller strain on the top of the gate electrode and spacers, the adverse effect caused by the second portion of the strained is reduced.

Strains can be generated by putting materials having different lattice constants into contact. Strains can also be adjusted by introducing impurities into the strained layer.

With a hybrid-strained layer, the strain in the channel region, particularly close to the surface of the channel region is significantly improved. Therefore, the device performance is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel semiconductor structure having a hybrid-strain-inducing layer and a method of forming the same is presented. The intermediate stages of manufacturing a preferred embodiment of the present invention are illustrated. The variations of the preferred embodiments are discussed. Throughout the various views and illustrative embodiments of the present invention, like reference numbers are used to designate like elements.

Figure 1:
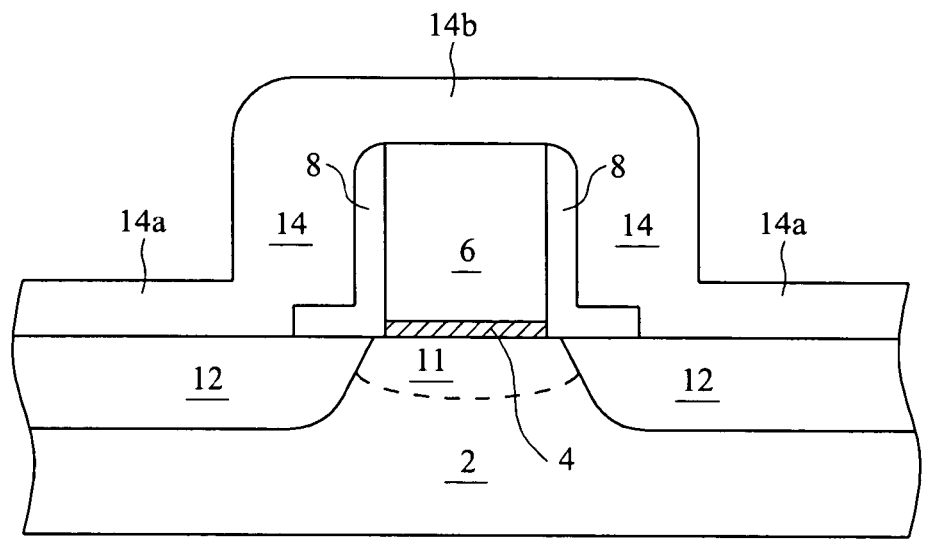
FIG. 1 illustrates a conventional uni-strained MOS device, a CES layer being formed on both source/drain regions and a gate structure.
Figure 2:
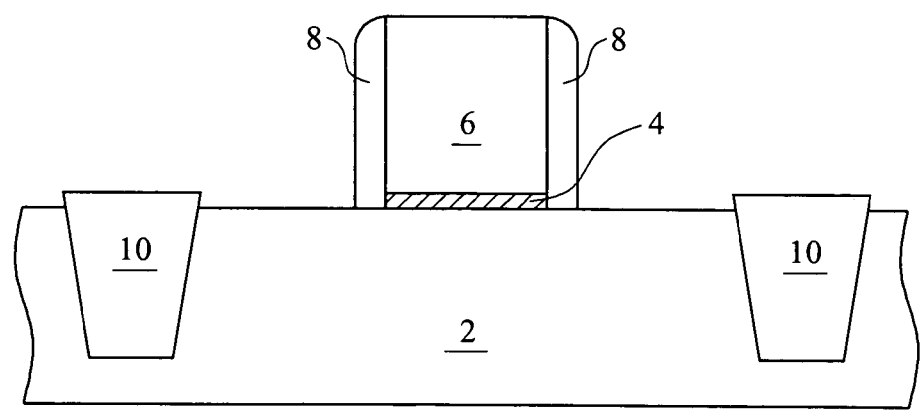
FIGS. 2 through 4 are cross-sectional views of intermediate stages in the manufacture of a hybrid-strained MOS transistor embodiment.

FIG. 2 illustrates the formation of shallow trench isolations (STI). In the preferred embodiment, substrate 2 is silicon substrate. In other embodiments, substrate 2 is a virtual substrate where a layer of relaxed SiGe is formed on graded SiGe, and a layer of strained Si is formed on the relaxed SiGe. This structure provides a tensile stress to the channel of the device and enhances carrier mobility. In yet other embodiments, bulk semiconductor, strained semiconductor, compound semiconductor, multi-layers semiconductor or silicon on insulator (SOI), strained silicon-on-insulator (SSOI), strained silicon germanium on insulator (S—SiGeOI), silicon germanium on insulator (SiGeOI), germanium on insulator (GeOI), and the like, can be used as substrate 2. STIs 10 are formed in the substrate 2. Preferably, the STIs 10 are formed by etching shallow trenches in substrate 2, and filling the trenches with an insulator such as silicon oxide.

A gate dielectric 4 is deposited on surface of substrate 2. The gate dielectric 4 may preferably be oxide. The forming method can be any of the known methods, such as thermal oxidation, local oxidation of silicon (LOCOS), chemical vapor deposition (CVD), etc. Silicon nitride can also be used since it is an effective barrier to impurity diffusion. The silicon nitride film is preferably formed by thermal nitridation of silicon. It can also be prepared by plasma anodic nitridation using nitrogen-hydrogen. The silicon nitride film may also be formed by thermal nitridation of $SiO_2$. The gate dielectric may also be oxy-nitride, oxygen-containing dielectric, nitrogen-containing dielectric, high-k materials or any combinations.

A gate electrode 6 is formed on gate dielectric 4. The gate electrode 6 is preferably polysilicon, although it may be formed of metal, or a compound structure comprising of metal, semiconductor, metal oxide and/or silicide. The preferred method of formation is CVD. The polysilicon has the ability of being used as a mask to achieve minimum gate-to-source/drain overlap. This in turn enhances the device performance. The polysilicon is then doped to reduce sheet resistance. Other embodiments may use amorphous silicon, elemental metals that are conductive, alloys of elemental metals that are conductive, silicides or nitrides of elemental metals that are conductive or any combination. Typically, the gate electrode 6 and gate dielectric 4 are deposited as layers and then patterned to form a gate.

A pair of spacers 8 is formed along the sidewalls of the gate dielectric 4 and gate electrode 6. As known in the art, spacers 8 are preferably formed by blanket depositing a dielectric layer over an entire region, then, anisotropically etching to remove the dielectric layer from horizontal surfaces, thus leaving spacers 8. FIG. 2 illustrates rectangular spacers. In another embodiment, spacers 8 can also be L-shaped, the formation of which is known in the art.

Figure 3:
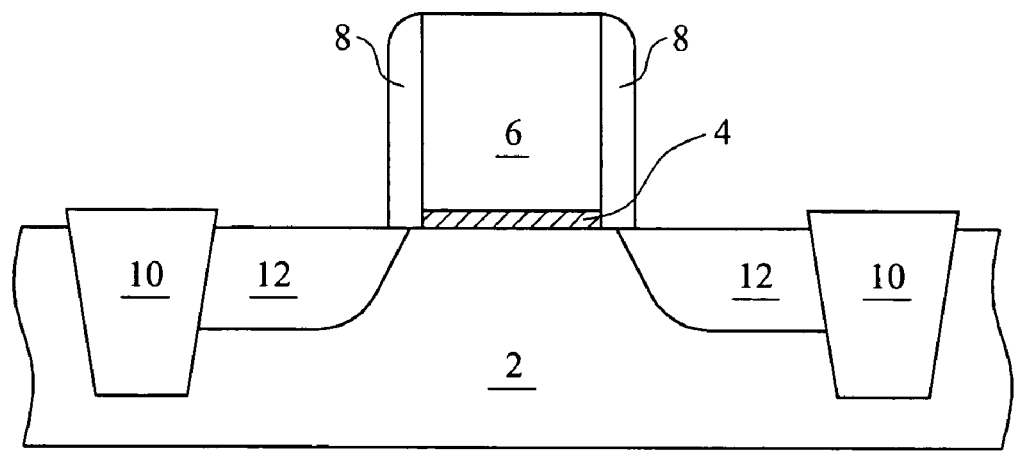

FIG. 3 illustrates the formation of source/drain regions 12. The source/drain regions 12 may be recessed in or elevated above the substrate 2 (using, e.g., epitaxially grown regions), in which case, the subsequently formed strain-inducing layer will also be recessed or elevated. In the preferred embodiment, the source/drain regions 12 are formed by implanting impurities into the semiconductor substrate 2. The spacers 8 are used as a mask so that edges of the source and drain regions 12 are substantially aligned with the spacer 8. Gate electrode 6 is preferably also implanted to reduce sheet resistance. In other embodiments, the source/drain regions 12 are formed by recessing the source/drain regions followed by epitaxially growing silicon, SiGe, or SiC in the recesses with desired dopant. In yet other embodiments, source/drain regions 12 are formed by expitaxially growing silicon, SiGe, or SiC with desired dopant on the top surface at substrate 2. Preferably, a $SiO_2$ film is formed in regions where no source and drain are to be formed. The subsequently deposited epitaxial film will be poly-crystaline where it forms on the $SiO_2$ film and can be subsequently removed. In the source/drain regions (i.e., where substrate 2 is exposed), single crystal epitaxial film is grown.

A pair of silicide regions (not shown) may optionally be formed by a salicide process on source/drain regions 12. The silicide is preferably $NiSi_2$, $CoSi_2$, $TiSi_2$ or the like. To form a silicide layer, preferably a metal layer is formed by first depositing a thin layer of metal, such as cobalt, nickel, titanium, or the like, over the device. The device is then annealed to form a silicide between the deposited metal and the underlying exposed silicon regions. Un-reacted metal is removed.

Next, as shown in FIGS. 4A, 4B, 4C and 4D, a strained layer (sometimes referred to herein as a "strain inducing layer") 14 is formed. Although this layer is preferably a CES layer and is interchangeably referred to as CES layer 14 throughout the description, it can be any strained layer or layers, even if the layer does not perform an etch stop function. The strained layer 14 may also be a composite layer comprising a CES layer and other layers. As previously discussed, this layer is strained in order to enhance the device performance. The types and strengths of the strain, also sometimes referred to as stress, are determined by the deposition process and material used. Generally, if a strained material has a smaller lattice constant than the underlying material, the strained material will have an inherent compressive strain and the underlying material will have an inherent tensile strain after relaxation. Conversely, if a strained material has a greater lattice constant than the underlying material, the strained material will have an inherent tensile strain and the underlying material will have an inherent compressive strain after relaxation.

Tensile strain is preferably generated between a strained layer 14 formed of materials such as silicon carbide, silicon nitride, oxide, and oxynitride on the one hand and the underlying materials, (i.e., substrate 2) on the other hand. Compressive strain may be generated between a strained layer 14 formed of materials such as silicon germanium, silicon nitride, oxide, oxynitride, and the underlying materials (i.e., substrate 2). The type and magnitude of the strain depend on the relative properties of the strained layer 14, and the underlying material. Strain can be adjusted by the type and concentration of impurities in the underlying material. For example, the introduction of impurities, such as germanium, into silicon germanium or silicon carbide typically increases the material's lattice constant (because germanium has a greater lattice constant), while the introduction of impurities, such as carbon, into silicon germanium or silicon carbide typically decreases its lattice constant (because carbon has a smaller lattice constant). In the preferred embodiment, CES layer 14 comprises a dielectric. In alternative embodiments, a strained layer 14 comprises semiconductors, metals, and combinations thereof. The strained layer 14 may also be in the form of single layer or composite layers. An advantageous feature of such material, as explained herein, is that these materials have an inherent stress when deposited, which induces a stress or strain in the underlying material.

Figure 4A:
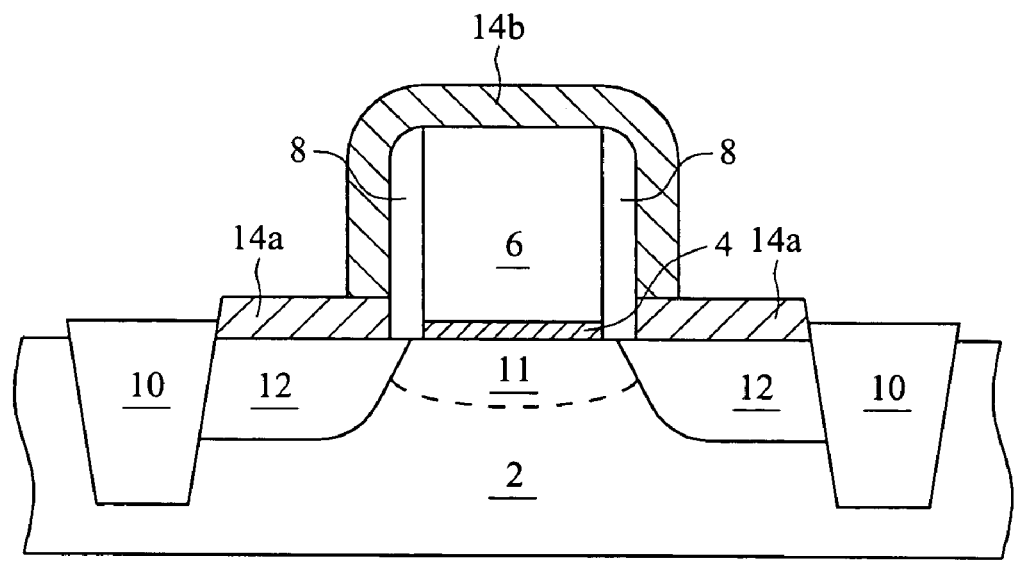

FIG. 4A illustrates a first strained layer portion, 14a selectively formed on the source/drain regions 12. Although portion 14a and subsequently discussed portion 14b are shown as one layer, they can be formed of different layers. In the preferred embodiment, a mask is used to cover the gate electrode 6 and spacers 8 during deposition of first portion 14a. In an alternative embodiment, a strain-inducing material is blanket deposited and then the strain-inducing material on the gate electrode 6 and spacers 8 is removed. The portion 14a can be formed by common methods such as chemical vapor deposition (CVD), selective epitaxy, atomic layer deposition (ALD), physical vapor deposition (PVD) and the like. The thickness of portion 14a is preferably greater than about 50 Å, more preferably between about 200 Å and 2000 Å.

A second strained layer portion, 14b is then formed over the gate structure. Photo patterning and etching may be needed to form the desired pattern. Second portion 14b is preferably formed by CVD, but other common methods such as ALD, PVD and the like can also be used. Similar to first portion 14a, the material of the second portion 14b is preferably dielectric. However, semiconductors, metals, their combinations and composite structures can also be used. The thickness of the second portion 14b is preferably greater than about 50 Å, more preferably between about 200 Å and 2000 Å. The stress in portion 14b is preferably between about 0 Gpa and about 3 Gpa. As shown, the strained layers 14a and 14b are preferably conformally deposited over the underlying materials (i.e. over gate electrode 6 and source/drain regions 12, respectively).

If second portion 14b has the same type of strain as the first portion 14a, the portions 14a and 14b generate opposing types of the strain in the channel region 11 as described above. This reduces the magnitude of the strain in the channel region 11. In order to reduce this adverse effect, second portion 14b preferably has smaller inherent strain, preferably less than 50% percent of the strain in first portion 14a. To further improve the strain in the channel regions 11, portions 14a and 14b preferably generate the same type of strain in the channel region 11. Therefore, it is more preferred that second portion 14b has an opposite type of strain as first portion 14a. It is even more preferred that the magnitude of the (opposite type of) strain in the second portion 14b is greater than 50 percent of the magnitude of the strain in the first portion 14a.

Figure 4B:
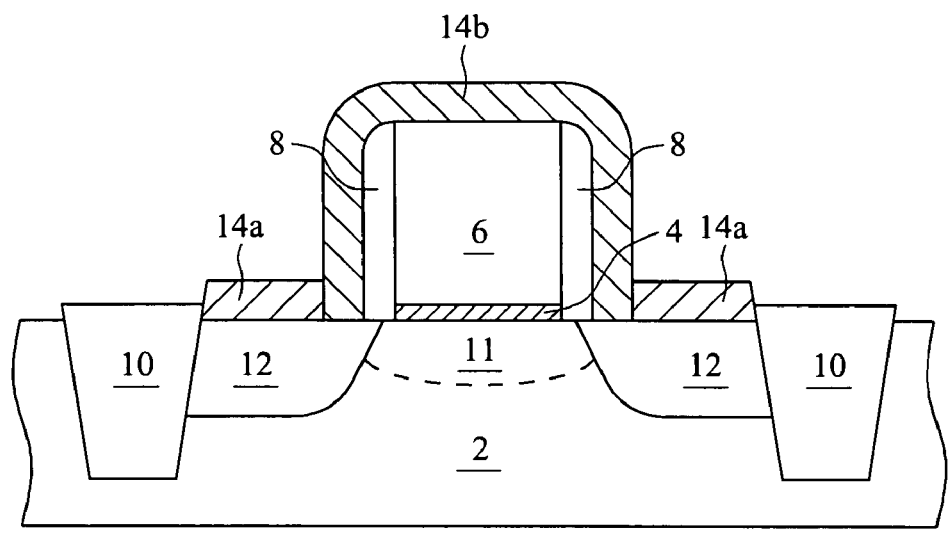

In the preferred embodiment shown in FIG. 4A, second portion 14b is formed on the first portion 14a. In other embodiments, as shown in FIG. 4B, second portion 14b covers the gate electrode 6, gate spacers 8 and extends to the source/drain regions 12. Preferably, second portion 14b is formed first and followed by the formation of first portion 14a in an embodiment such as illustrated in FIG. 4B.

Figure 4C:
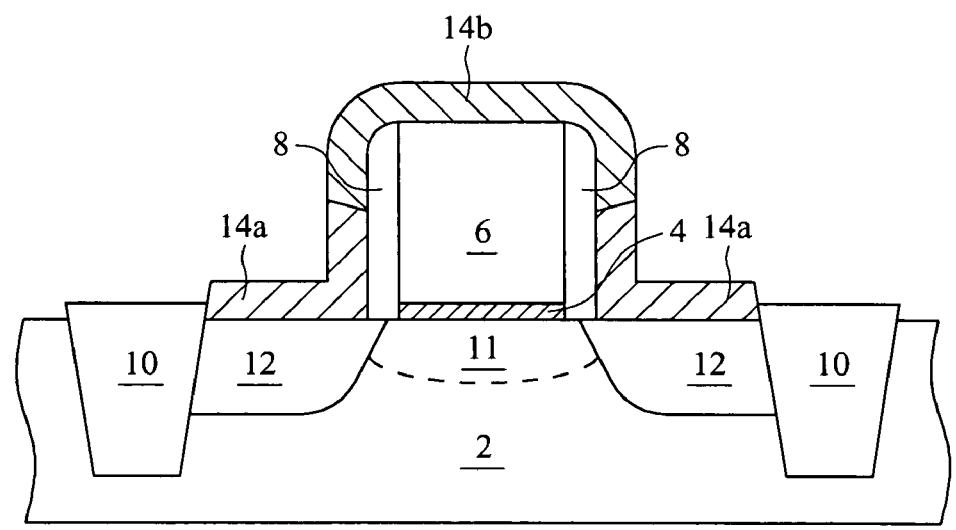

In yet other embodiments, the strained layer portions 14a and 14b may have irregular shapes, an example of which is shown in FIG. 4C. Regardless of the irregular shapes of the portions 14a and 14b, first portion 14a is substantially over the gate electrode 6 and gate spacers 8, and second portion 14b is substantially over the source/drain regions 12. Therefore, they cumulatively cause same type of strain in the channel region 11 (assuming, as is the case in those embodiments, that the portions generate opposite strain).

Figure 4D:
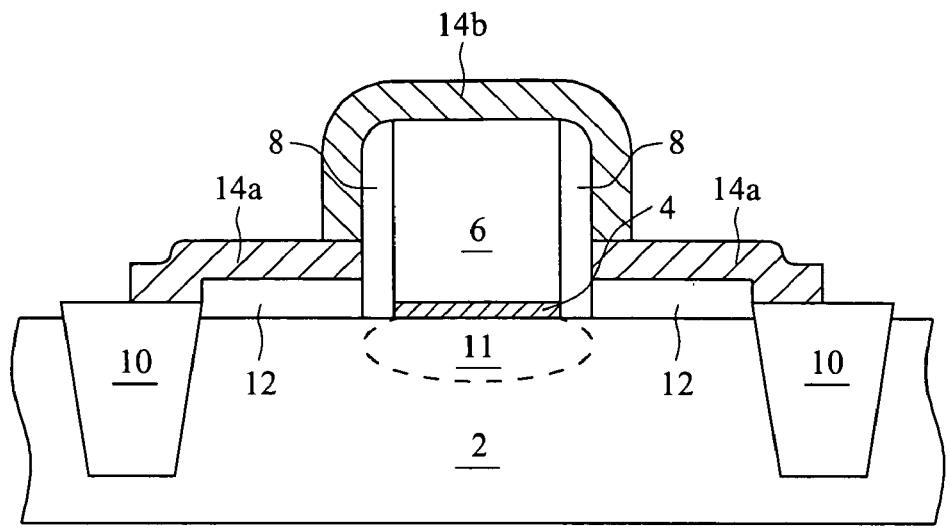

FIG. 4D illustrates an elevated strained layer 14. In this embodiment, source/drain regions 12 are epitaxially grown on the substrate 2 and thus are raised. Therefore, strained layer 14 is elevated. The channel stress modulation effect is somewhat degraded in such an embodiment. Conversely, when the source/drain regions 12 are recessed (not shown), their overlying strained layer portion 14a is also recessed. Typically, the channel stress modulation effect is enhanced by a recessed S/D structure. If a silicide is formed on source/drain regions 12, the top surface of the silicide may be higher than the surface of the chip, and thus the overlying CES portion 14b is also elevated, and again stress modulation in the channel region is slightly degraded by the elevated S/D structure. Therefore, the source/drain regions 12 are preferably recessed. The strained layer 14 may be formed substantially coterminous with source/drain regions 12. Alternatively, it may extend to above the STIs 10 such as shown in FIG. 4D.

Structures shown in FIGS. 4A, 4B, 4C and 4D can be used for both pMOS and nMOS devices. For pMOS devices, the strained layer portion 14a preferably has compressive strain, the strained layer portion 14b preferably has tensile strain, and the channel region 11 has a resulting compressive strain. Conversely, for NMOS devices, the strained layer portion 14a preferably has tensile strain, the strained layer portion 14b preferably has compressive strain, and the channel region 11 has a resulting tensile strain.

Figure 5:
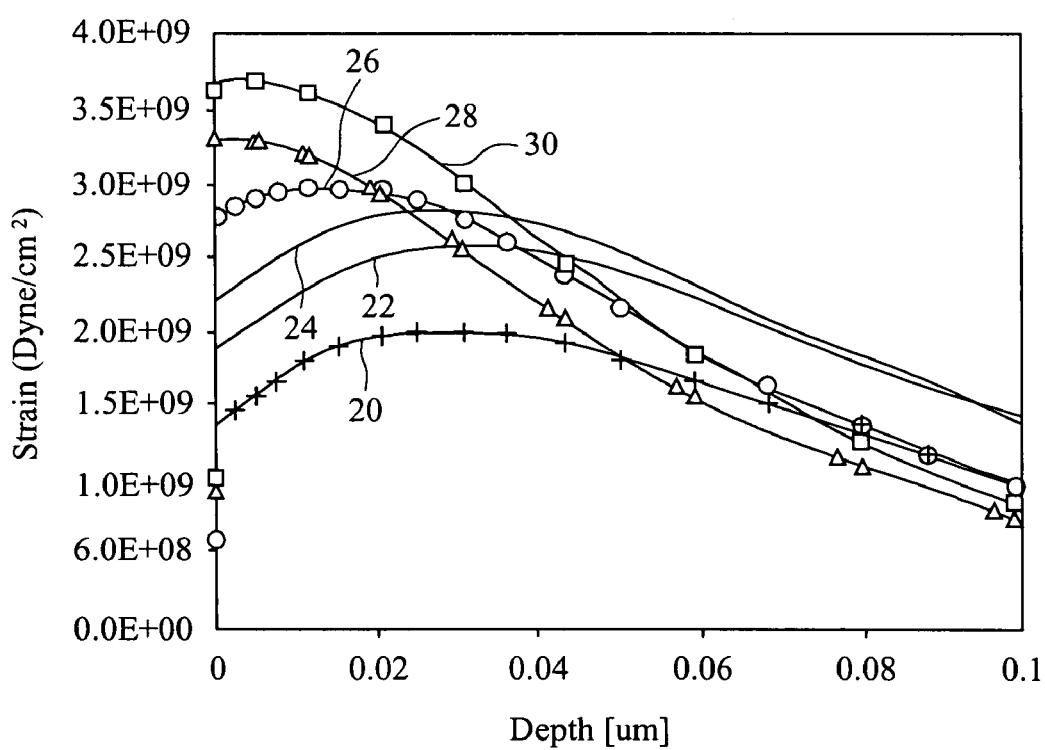
FIG. 5 illustrates results of the preferred embodiments, strain being shown as a function of depth in channel region.

FIG. 5 is the results obtained from simulating the results of using a strained layer on an NMOS device. Lines 20, 22, and 24 illustrates the results of simulations using a conventional uni-strained contact etch stop layer of silicon nitride with about 1.3 Gpa tensile stress. A contact etch stop (CES) layer of about 300 Å is illustrated in the simulation results of line 20; the results of a simulation for a 600 Å layer is illustrated by line 22; and the results of a simulation for a 900 Å layer is shown by line 24. Strain data is shown as a function of depth in the channel region 11. It is noted that line 26 illustrates a simulation in which the gate electrode is uncapped (meaning the strained layer is not formed atop the gate electrode or is subsequently removed therefrom. As illustrated, the uncapped device has a significantly higher strain in the channel region than the other simulations (lines 20, 22 and 24). This is because the uncapped embodiment does not have the adverse effect caused by the strained layer on the gate, as discussed above. Line 30 illustrates the results for a hybrid-strained layer, such as a hybrid CES layer. The hybrid-strained structure shown in FIG. 4A has higher strain (as illustrated by simulation results line 30) in the channel region than the hybrid-strained structure shown in FIG. 4B (illustrated by simulation results line 28). Therefore, the embodiment shown in FIG. 4A is more preferred. FIG. 5 indicates that the strain increases when the thickness of the CES layer increases (as illustrated by lines 20, 22, and 24). However, if the structures with the same CES thickness are compared, less strain is applied by a uni-strained CES (line 20) than an uncapped CES (line 26) and a hybrid-strained CES (line 30).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a gate dielectric over a substrate;
a gate electrode over the gate dielectric having a top;
a source/drain region substantially aligned with an edge of the gate electrode;
a first strained layer substantially conformally over the source/drain region but not over the gate electrode, with a first stress; and
a second strained layer substantially conformally over the gate electrode, with a second stress, wherein the second stress is substantially different from the first stress.

2. The semiconductor device of claim 1 wherein the first strained layer extends substantially to the gate electrode and wherein the second strained layer has a portion formed an the first strained layer.

3. The semiconductor device of claim 1 wherein the second strained layer extends from the top of the gate electrode to the source/drain region and wherein the first strained layer is adjacent a sidewall of the second strained layer.

4. The semiconductor device of claim 1 wherein the first and second strained layers respectively comprise a material selected from the group consisting essentially of silicon nitride, oxide, oxynitride, silicon carbide, semiconductor materials, metals, and combinations thereof.

5. The semiconductor device of claim 1 wherein the first and second strained layers respectively comprise multiple layers.

6. The semiconductor device of claim 1, wherein the first and second strained layers respectively have a thickness of between about 20 nm and about 200 nm.

7. The semiconductor device of claim 1 wherein the second strained layer has an opposite stress type to the first strained layer and wherein the magnitude of the stress in the second strained layer is between about 0 Gpa and about 3 Gpa.

8. The semiconductor device of claim 1 wherein the second strained layer has the same type of stress as the first strained layer and wherein the second stress is less than about 50 percent of the first stress.

9. The semiconductor device of claim 1 wherein the first strained layer and the second strained layer collectively form a contact etch stop layer.

10. The semiconductor device of claim 1 wherein the first strained layer and the second strained layer have substantially different lattice constants.

11. A semiconductor device comprising:
a gate dielectric over a substrate;
a gate electrode over the gate dielectric having a top and a sidewall;
a source/drain region substantially aligned with an edge of the gate electrode; and
a strained layer comprising:
a first region having a first stress substantially over the source/drain region but not over the gate electrode; and
a second region having a second stress, different from the first stress, the second region being substantially over the gate electrode, wherein the first and second regions have an interface only substantially close to the sidewall of the gate electrode.

12. The semiconductor device of claim 11 wherein the first region and the second region comprise materials having substantially different lattice constants.

13. The semiconductor device of claim 11 wherein the magnitude of the stress in the second region is between about 0 Gpa and about 3 Gpa.

14. The semiconductor device of claim 11 wherein the strained layer is a contact etch stop layer.

15. A semiconductor device comprising:
a gate dielectric over a substrate;
a gate electrode over the gate dielectric;
a gate spacer along a sidewall of the gate dielectric and the gate electrode;
a source/drain region substantially aligned with an edge of the gate electrode;
a strained layer substantially over the source/drain region, gate electrode and gate spacers wherein the strained layer has a first portion, a second portion, and an interface portion connecting the first portion and the second portion;
wherein the first portion is substantially over the source/drain region, and the second portion is substantially over the gate electrode; and
wherein the interface portion is adjacent a sidewall of the gate spacer, and wherein the interface portion does not extend substantially over the gate electrode.

16. The semiconductor device of claim 15 wherein the interface portion is substantially along a sidewall of the gate spacer.

17. The semiconductor device of claim 15 wherein the first portion is under a first strain type.

18. The semiconductor device of claim 17 wherein the second portion is under a second strain type, opposite to the first strain type.

19. The semiconductor device of claim 15 wherein the first portion and second portion cumulatively form a contact etch stop layer.

20. The semiconductor device of claim 15 wherein the interface portion is an interface between the first portion and the second portion.

* * * * *